United States Patent
Daimon

(10) Patent No.: US 11,588,469 B2
(45) Date of Patent: Feb. 21, 2023

(54) ACOUSTIC WAVE DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 1134 days.

(21) Appl. No.: 16/158,333

(22) Filed: Oct. 12, 2018

(65) Prior Publication Data
US 2019/0123713 A1    Apr. 25, 2019

(30) Foreign Application Priority Data

Oct. 20, 2017  (JP) .............................. JP2017-203112

(51) Int. Cl.
*H03H 9/145* (2006.01)
*H03H 9/02* (2006.01)
*H03H 9/25* (2006.01)
*H03H 9/64* (2006.01)

(52) U.S. Cl.
CPC ...... *H03H 9/1457* (2013.01); *H03H 9/02559* (2013.01); *H03H 9/02574* (2013.01); *H03H 9/02637* (2013.01); *H03H 9/02866* (2013.01); *H03H 9/02992* (2013.01); *H03H 9/14532* (2013.01); *H03H 9/25* (2013.01); *H03H 9/6496* (2013.01)

(58) Field of Classification Search
CPC ............. H03H 9/1457; H03H 9/02559; H03H 9/02574; H03H 9/02637; H03H 9/02866; H03H 9/02992; H03H 9/14532; H03H 9/25; H03H 9/6496
See application file for complete search history.

(56) References Cited

U.S. PATENT DOCUMENTS

| | | |
|---|---|---|
| 2011/0068655 A1 | 3/2011 | Solal et al. |
| 2013/0051588 A1 | 2/2013 | Ruile et al. |
| 2013/0249647 A1 | 9/2013 | Nakanishi et al. |
| 2014/0001919 A1 | 1/2014 | Komatsu et al. |

(Continued)

FOREIGN PATENT DOCUMENTS

| | | |
|---|---|---|
| CN | 105284047 A | 1/2016 |
| CN | 105814794 A | 7/2016 |

(Continued)

OTHER PUBLICATIONS

Official Communication issued in corresponding Japanese Patent Application No. 2017-203112, dated Feb. 12, 2020.

(Continued)

*Primary Examiner* — Samuel S Outten

(74) *Attorney, Agent, or Firm* — Keating & Bennett, LLP

(57) ABSTRACT

An acoustic wave device includes a multilayer substrate including a reverse-velocity surface, a piezoelectric film, a low acoustic velocity material layer, a high acoustic velocity material layer, and an IDT electrode disposed on the piezoelectric film. In the IDT electrode, gap lengths of a first gap between a tip of each of first electrode fingers and a second busbar and a second gap between a tip of each of second electrode fingers and a first busbar are about $0.23\lambda$ or shorter, the gap lengths extending in an extension direction of the first and second electrode fingers.

17 Claims, 15 Drawing Sheets

(56) References Cited

U.S. PATENT DOCUMENTS

| | | | |
|---|---|---|---|
| 2016/0072475 | A1 | 3/2016 | Mimura et al. |
| 2016/0294354 | A1* | 10/2016 | Saijo ..................... H03H 9/145 |
| 2016/0294361 | A1 | 10/2016 | Yamane et al. |
| 2017/0222619 | A1 | 8/2017 | Iwamoto et al. |
| 2018/0097508 | A1 | 4/2018 | Iwamoto et al. |

FOREIGN PATENT DOCUMENTS

| | | | |
|---|---|---|---|
| JP | 11-298286 | A | 10/1999 |
| JP | 2011-101350 | A | 5/2011 |
| JP | 2013-518455 | A | 5/2013 |
| JP | 2013-544041 | A | 12/2013 |
| JP | 2016-184951 | A | 10/2016 |
| JP | 2017-112603 | A | 6/2017 |
| WO | 2012/127793 | A1 | 9/2012 |
| WO | 2014/192756 | A1 | 12/2014 |
| WO | 2015/098756 | A1 | 7/2015 |
| WO | 2016/084526 | A1 | 6/2016 |
| WO | 2016/208446 | A1 | 12/2016 |

OTHER PUBLICATIONS

First Office Action in CN201811213199.0, dated Nov. 14, 2022, 8 pages.

\* cited by examiner

ACOUSTIC WAVE DEVICE

CROSS REFERENCE TO RELATED APPLICATIONS

This application claims the benefit of priority to Japanese Patent Application No. 2017-203112 filed on Oct. 20, 2017. The entire contents of this application are hereby incorporated herein by reference.

BACKGROUND OF THE INVENTION

1. Field of the Invention

The present invention relates to an acoustic wave device including a multilayer substrate in which a high acoustic velocity material layer, a low acoustic velocity material layer, and a piezoelectric film are laminated.

2. Description of the Related Art

An IDT (interdigital transducer) electrode of an acoustic wave device includes first and second busbars opposing to each other, a plurality of first electrode fingers, and a plurality of second electrode fingers. One end of each of the first electrode fingers is connected to the first busbar. One end of each of the second electrode fingers is connected to the second busbar. Tips of the first electrode fingers are arranged with gaps interposed between the tips and the second busbar. Tips of the second electrode fingers are arranged with gaps interposed between the tips and the first busbar. Japanese Unexamined Patent Application Publication No. 2011-101350 discloses that wave guide is performed when a length of the gaps is 1λ or longer, and that the gap length is more desirably 3λ or longer.

As disclosed in Japanese Unexamined Patent Application Publication No. 2011-101350, it has been considered that the gap between the tip of the electrode finger and the busbar desirably has a longer length.

However, the inventor of preferred embodiments of the present invention has discovered that a propagation loss increases at a longer gap length in an acoustic wave device in which a piezoelectric substrate is a multilayer substrate. In particular, a propagation loss tends to increase in a multilayer substrate in which a high acoustic velocity material layer, a low acoustic velocity material layer, and a piezoelectric film are laminated. The term "high acoustic velocity material" denotes a material in which the acoustic velocity of a bulk wave propagating in the material is higher than the propagation velocity of an acoustic wave propagating in the piezoelectric film. The term "low acoustic velocity material" denotes a material in which the acoustic velocity of a bulk wave propagating in the material is lower than the propagation velocity of the bulk wave propagating in the piezoelectric film.

SUMMARY OF THE INVENTION

Preferred embodiments of the present invention provide acoustic wave devices each including a multilayer substrate and having a reduced propagation loss.

According to a preferred embodiment of the present invention, an acoustic wave device includes a multilayer substrate including a reverse-velocity surface (the inverse of SAW-phase velocity), the multilayer substrate including a piezoelectric film, a low acoustic velocity material layer in which a bulk wave having a lower velocity than an acoustic velocity of an acoustic wave propagating in the piezoelectric film propagates, and a high acoustic velocity material layer in which a bulk wave having higher velocity than the acoustic velocity of the acoustic wave propagating in the piezoelectric film propagates, the low acoustic velocity material layer being disposed between the high acoustic velocity material layer and the piezoelectric film; and an IDT electrode disposed on the piezoelectric film, wherein the IDT electrode includes first and second busbars opposing each other, a plurality of first electrode fingers extending from the first busbar toward the second busbar, and a plurality of second electrode fingers extending from the second busbar toward the first busbar, and wherein gap lengths of a first gap between a tip of each of the first electrode fingers and the second busbar and a second gap between a tip of each of the second electrode fingers and the first busbar are about 0.23λ or shorter, the gap lengths being measured in an extension direction of the first and second electrode fingers.

In an acoustic wave device according to a preferred embodiment of the present invention, in the IDT electrode, an intersecting region in which the first electrode fingers and the second electrode fingers are overlapped with each other in a propagation direction of the acoustic wave includes a central region at a middle in the extension direction of the first and second electrode fingers, and first and second edge regions on both of the outer sides of the central region in the extension direction of the first and second electrode fingers, and the acoustic velocity in each of the first and second edge regions is lower than the acoustic velocity in the central region. In such a case, transverse mode ripples are reduced or prevented.

In an acoustic wave device according to a preferred embodiment of the present invention, widths of the first and second electrode fingers in the first and second edge regions are greater than widths of the first and second electrode fingers in the central region, the widths being measured in the propagation direction of the acoustic wave.

In an acoustic wave device according to a preferred embodiment of the present invention, each of the first and second busbars includes a plurality of openings arrayed side by side in the propagation direction of the acoustic wave, portions of the first and second busbars on a side closer to the intersecting region than the openings define and function as first and second thin busbar portions, and portions of the first and second busbars on a side farther away from the intersecting region than the openings define and function as first and second outer busbar portions, the first and second thin busbar portions being connected respectively to the first and second outer busbar portions by connecting portions between the adjacent openings.

In an acoustic wave device according to a preferred embodiment of the present invention, the piezoelectric film is made of LiTaO$_3$ and has a thickness of about 3.5λ or smaller. In such a case, a Q value is increased.

In an acoustic wave device according to a preferred embodiment of the present invention, the high acoustic velocity material layer may be a support substrate made of a high acoustic velocity material.

The acoustic wave device according to a preferred embodiment of the present invention may further include a support substrate that supports the high acoustic velocity material layer.

In an acoustic wave device according to a preferred embodiment of the present invention, first dielectric films that define mass adding films are laminated on the first and second edge regions.

In an acoustic wave device according to a preferred embodiment of the present invention, metal films that define mass adding films are laminated on portions of the first and second electrode fingers positioned in the first and second edge regions.

In an acoustic wave device according to a preferred embodiment of the present invention, the first dielectric films are further laminated on the first and second busbars and over the first and second gaps.

In an acoustic wave device according to a preferred embodiment of the present invention, a second dielectric film that defines a frequency adjustment film is laminated on the IDT electrode, and the first dielectric films are laminated with the second dielectric film interposed between the IDT electrode and the first dielectric films.

According to preferred embodiments of the present invention, propagation losses are able to be reduced or prevented in the acoustic wave devices including the multilayer substrate in which the high acoustic velocity material layer, the low acoustic velocity material layer, and the piezoelectric film are laminated.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the drawings.

It is to be noted that the preferred embodiments described in this specification are merely illustrative, and that partial replacements and combinations of individual components may be made between the different preferred embodiments.

Figure 2:
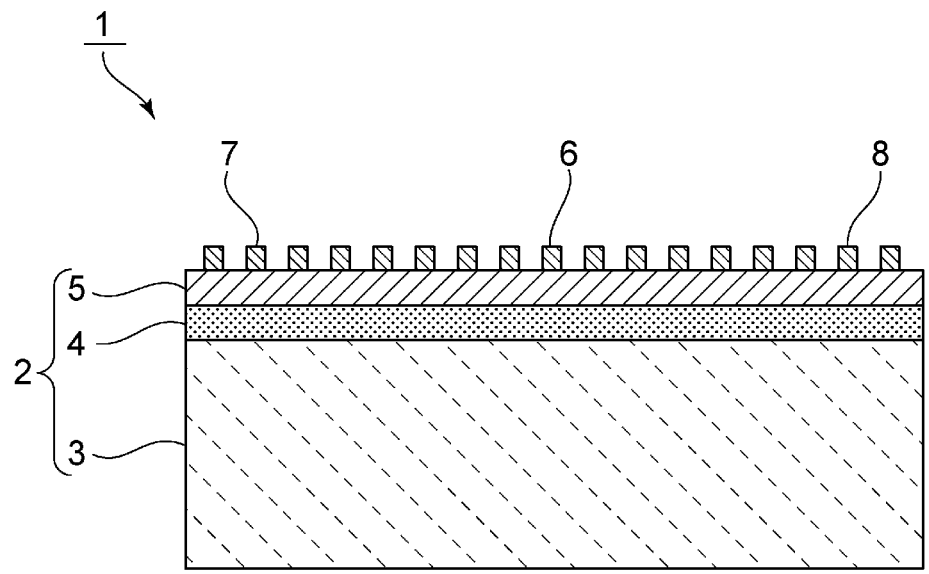
FIG. 2 is a schematic front sectional view of the acoustic wave device according to the first preferred embodiment of the present invention.
Figure 3:
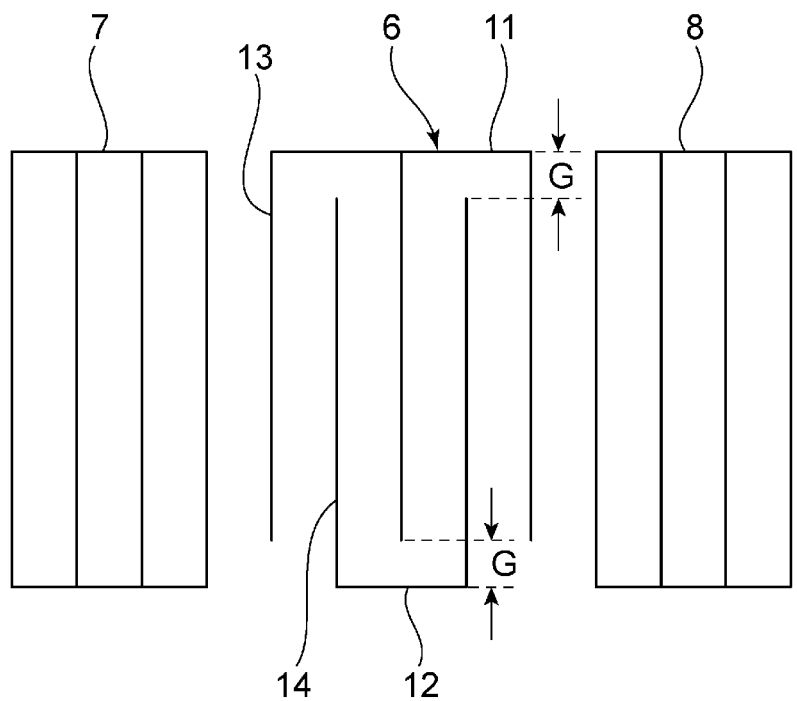
FIG. 3 is a schematic plan view illustrating the electrode structure of the acoustic wave device according to the first preferred embodiment of the present invention.

FIG. 2 is a schematic front sectional view of an acoustic wave device 1 according to a first preferred embodiment of the present invention, and FIG. 3 is a schematic plan view illustrating an electrode structure of the acoustic wave device.

The acoustic wave device 1 includes a multilayer substrate 2. The multilayer substrate 2 includes a high acoustic velocity support substrate 3 defining a high acoustic velocity material layer, a low acoustic velocity material layer 4, and a piezoelectric film 5 preferably made of $LiTaO_3$, for example. The low acoustic velocity material layer 4 and the piezoelectric film 5 are laminated on the high acoustic velocity support substrate 3 in that order. An IDT electrode 6 and reflectors 7 and 8 are disposed on the piezoelectric film 5. A one-port acoustic wave resonator is thus provided.

A high acoustic velocity material defining the high acoustic velocity material layer is a material such that the acoustic velocity of a bulk wave propagating in the material is higher than the acoustic velocity of an acoustic wave propagating in the piezoelectric film 5. A low acoustic velocity material defining the low acoustic velocity material layer 4 is a material such that the acoustic velocity of a bulk wave propagating in the material is lower than the acoustic velocity of the acoustic wave propagating in the piezoelectric film 5. In the multilayer substrate 2 including the low acoustic velocity material layer 4 and the piezoelectric film 5 laminated on the high acoustic velocity support substrate 3, energy of the acoustic wave is effectively confined inside the piezoelectric film 5.

In this connection, as described above, the inventor of preferred embodiments of the present invention discovered that, when the multilayer substrate 2 is used, a propagation loss increases as a gap size in the IDT electrode 6 increases.

As illustrated in FIG. 3, the IDT electrode 6 includes first and second busbars 11 and 12 opposing each other. One end of each a plurality of first electrode fingers 13 is connected to the first busbar 11. The first electrode fingers 13 extend toward the second busbar 12. One end of each of a plurality of second electrode fingers 14 is connected to the second busbar 12. The second electrode fingers 14 extend toward the first busbar 11.

A space between a tip of each first electrode finger 13 and the second busbar 12 is a first gap. A space between a tip of each second electrode finger 14 and the first busbar 11 is a second gap. Lengths of the first and second gaps in an extension direction of the first and second electrode fingers 13 and 14 are each referred to as a gap length G hereinafter.

In the acoustic wave device 1, the gap length G is preferably set to about $0.23\lambda$ or shorter, for example, such that the propagation loss is able to be reduced.

Figure 1:
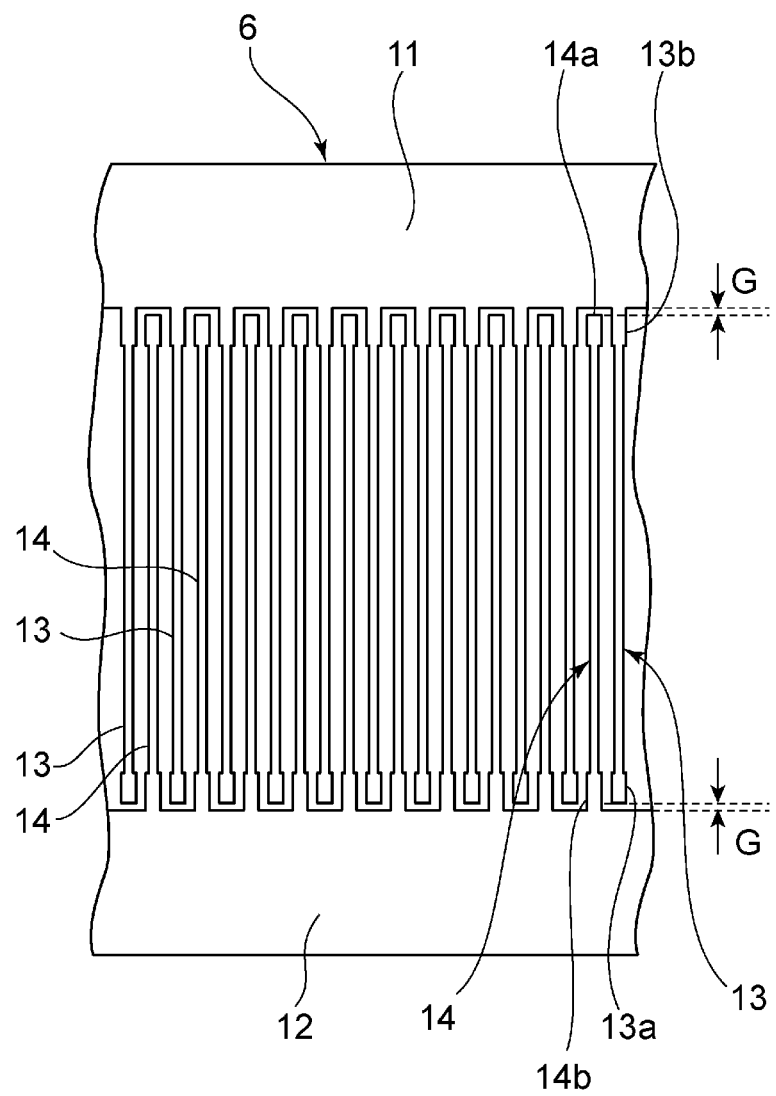
FIG. 1 is a partial plan view illustrating a principal portion of an electrode structure of an acoustic wave device according to a first preferred embodiment of the present invention.
Figure 4:
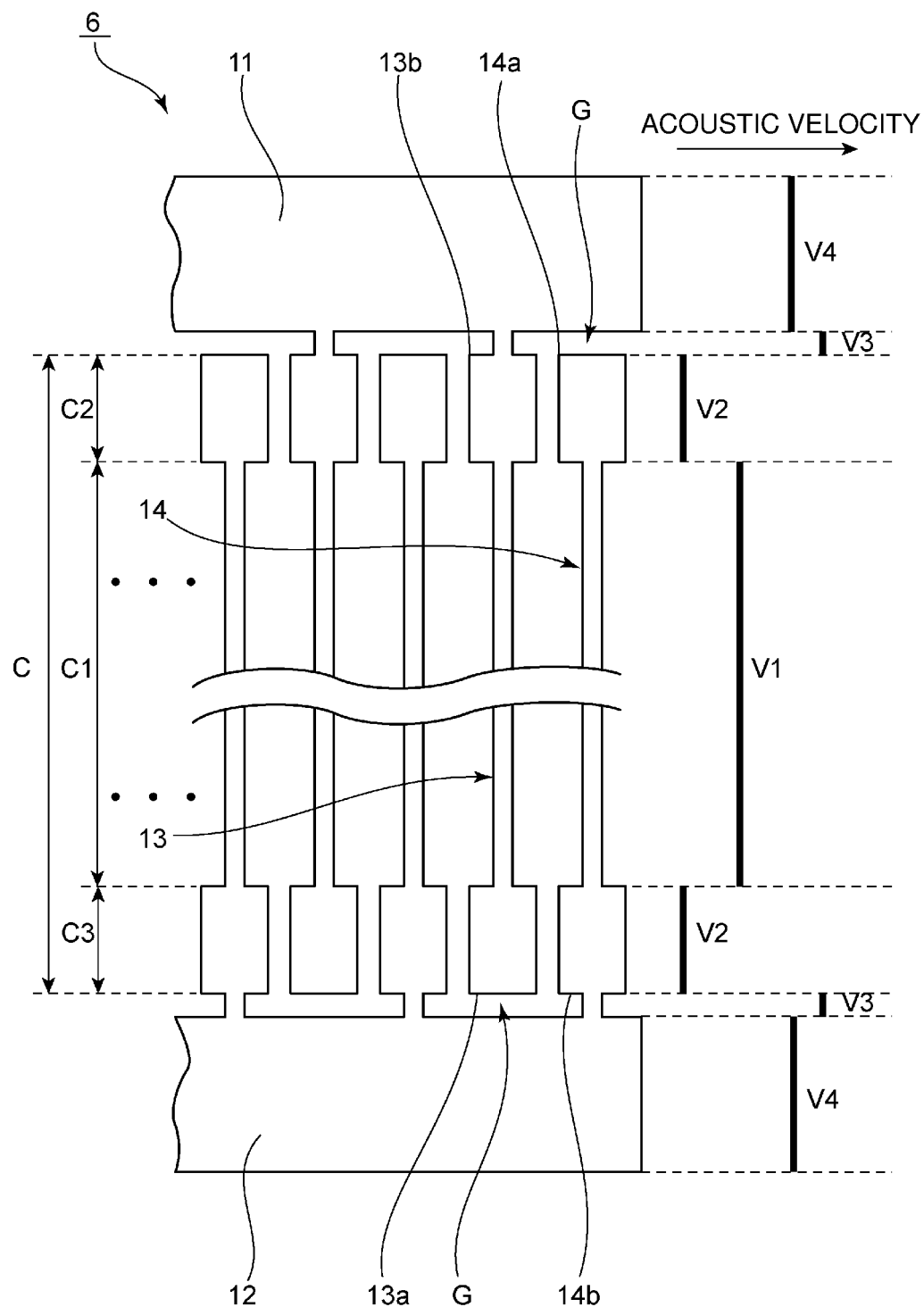
FIG. 4 is a partial enlarged plan view, partly cut out, illustrating a portion of FIG. 1 in an enlarged scale.

FIG. 3 schematically illustrates the IDT electrode 6, while FIGS. 1 and 4 illustrate a principal portion of the IDT electrode 6 in an enlarged scale. In addition, FIG. 4 further indicates the acoustic velocities in various regions. Each of the first electrode fingers 13 includes greater width portions 13a and 13b. The "width of an electrode finger" means the dimension of the electrode finger in the propagation direction of an acoustic wave. Each of the second electrode fingers 14 also includes greater width portions 14a and 14b. The greater width portions 13a and 14a are provided on the tip sides of the first and second electrode fingers 13 and 14, respectively. The greater width portion 13b is disposed at a position opposing the greater width portion 14a in the propagation direction of the acoustic wave. The greater width portion 14b is disposed in an opposing relationship to the greater width portion 13a in the propagation direction of the acoustic wave.

Accordingly, an intersecting region C, i.e., a region at which the first electrode fingers 13 and the second electrode fingers 14 are overlapped with each other in the propagation direction of the acoustic wave, includes a central region C1, and first and second edge regions C2 and C3 on both the outer sides of the central region C1 in a direction perpendicular or substantially perpendicular to the propagation direction of the acoustic wave. Furthermore, a space on the outer side of the first edge region C2 provides a gap region at which the second gap is provided, the gap region being called a "second gap region". A space on the outer side of the second edge region C3 in the direction perpendicular or substantially perpendicular to the propagation direction of the acoustic wave provides a first gap region at which the first gap is provided. Regions on the outer sides of the first and second gap regions provide regions at which the second busbar 12 and the first busbar 11 are provided, respectively. FIG. 4 diagrammatically indicates the acoustic velocities in the above-described regions. Regarding the acoustic velocities in the above-described regions illustrated in FIG. 4, the acoustic velocity is higher toward the right in FIG. 4.

In the acoustic wave device 1, the IDT electrode 6 is designed as follows. The acoustic velocity V2 in the first and second edge regions C2 and C3 is lower than the acoustic velocity V1 in the central region C1. The gap regions having the acoustic velocity V3 are provided on the outer sides of the first and second edge regions C2 and C3. In addition, the acoustic velocity in the regions at which the first and second busbars 11 and 12 are provided is V4 that is lower than V3. Levels of the acoustic velocities V1 to V4 preferably have a relationship of V3>V4>V1>V2.

In the case of using the multilayer substrate, transverse modes cause a problem. By designing the IDT electrode 6 to satisfy the above relationship among the acoustic velocities, the transverse modes are reduced or prevented due to the difference in the acoustic velocity. It is, however, to be noted that the present invention is not limited to acoustic wave devices including electrode structures that reduce or prevent the transverse modes.

As described above, the acoustic wave device 1 includes the gap length G that is preferably about $0.23\lambda$ or shorter, for example. In the acoustic wave device 1, the gap regions and the regions at which the first and second busbars 11 and 12 are disposed define high acoustic velocity regions. Accordingly, even though the gap length G is small, a piston mode is provided, and the transverse modes are reduced or prevented. As a result, the propagation loss is reduced. That point will be described below with reference to concrete experimental examples.

The acoustic wave device 1 was fabricated with the following design parameters.

Structure of the multilayer substrate 2; the high acoustic velocity support substrate 3: Si substrate, the low acoustic velocity material layer 4: $SiO_2$ film having a thickness of about $0.3\lambda$, the piezoelectric film 5: $LiTaO_3$ film having Euler Angles (0°, 140°, 0°) and a thickness of about $0.3\lambda$ Materials of the IDT electrode 6 and the reflectors 7 and 8: Al Number of pairs of the electrode fingers of the IDT electrode 6: 100 pairs Duty of the IDT electrode 6: about 0.45

Number of the electrode fingers of the reflectors 7 and 8: 20 pairs

Figure 6:
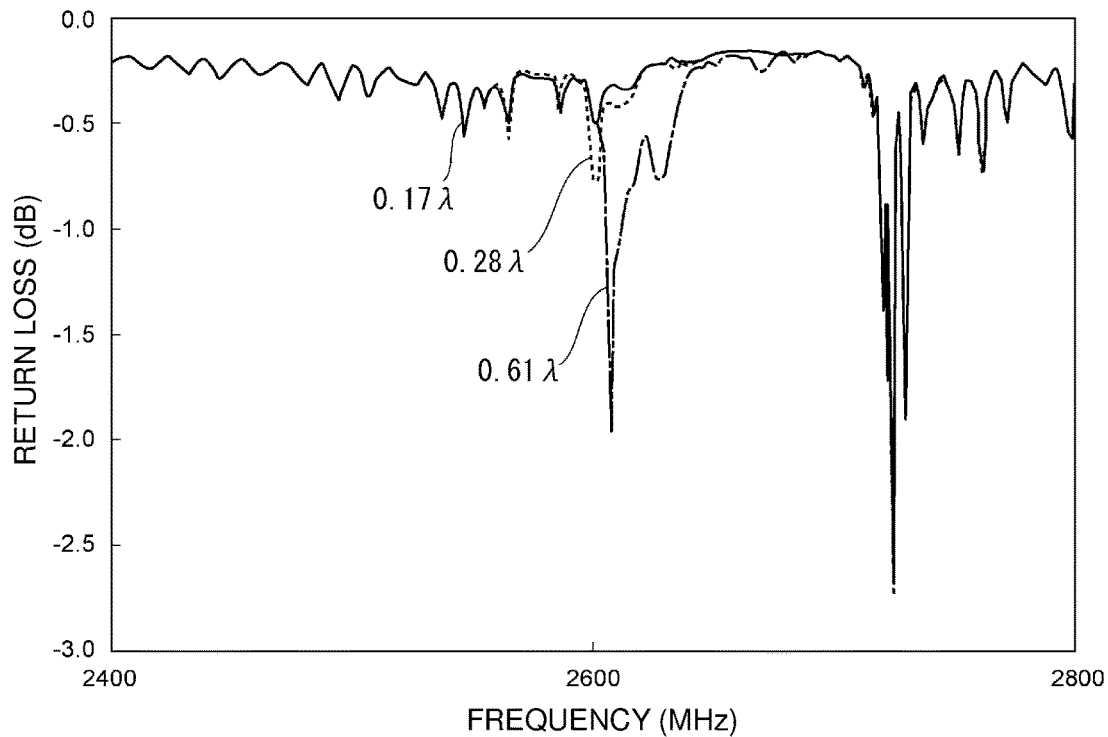
FIG. 6 is a graph representing return loss characteristics of the acoustic wave device in which a gap length G is about $0.17\lambda$, about $0.28\lambda$, or about $0.61\lambda$.

Film thicknesses of the IDT electrode 6 and the reflectors 7 and 8: about $0.05\lambda$, $\lambda$=about 2 μm The acoustic wave device 1 was fabricated in three configurations with the gap length G set to about $0.17\lambda$, about $0.28\lambda$, and about $0.61\lambda$, for example. FIG. 6 plots return loss characteristics of the fabricated acoustic wave devices.

As shown in FIG. 6, the return loss characteristics are worst when the gap length G is about $0.61\lambda$, and are somewhat improved at about $0.28\lambda$. At about $0.17\lambda$, the return loss characteristics are most preferable. It is thus understood that the propagation loss is reduced by setting the gap length to about $0.17\lambda$.

Figure 7:
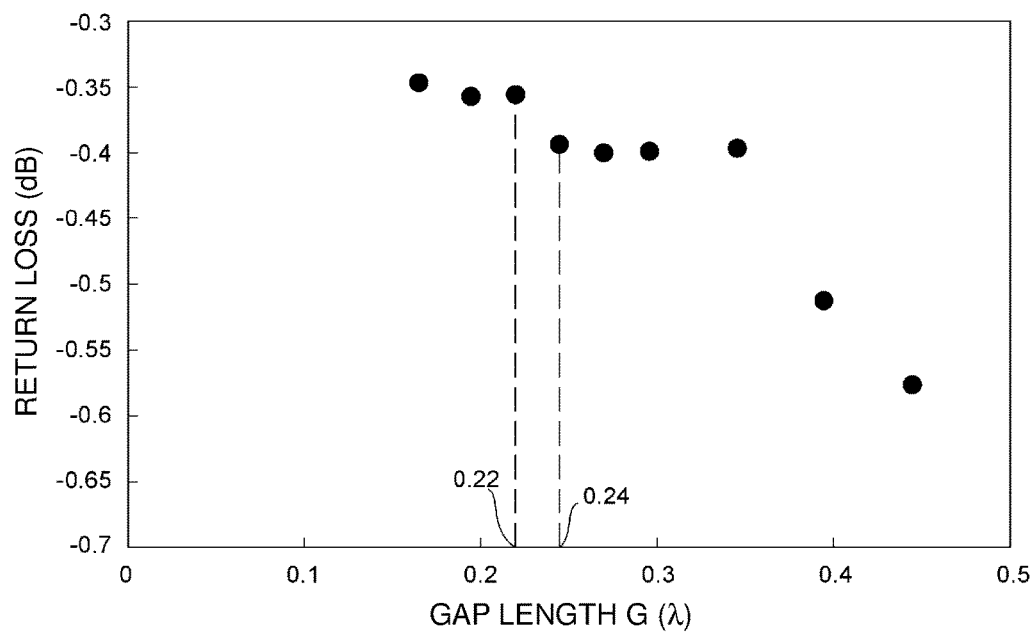
FIG. 7 is a graph representing a relationship between the gap length G in an IDT electrode and return loss.

Taking the above-described result into account, the return loss characteristics were evaluated while the gap length G was more finely changed in the acoustic wave device 1. FIG. 7 represents the evaluation result. Values of the return loss represented in FIG. 7 denote values measured in a range near 2600 MHz where the return loss is the worst.

As shown in FIG. 7, when the gap length G is about $0.24\lambda$ or longer, the return loss is relatively large. On the other hand, at about $0.23\lambda$ or shorter, the return loss is reduced, and thus the propagation loss is reduced.

Figure 5:
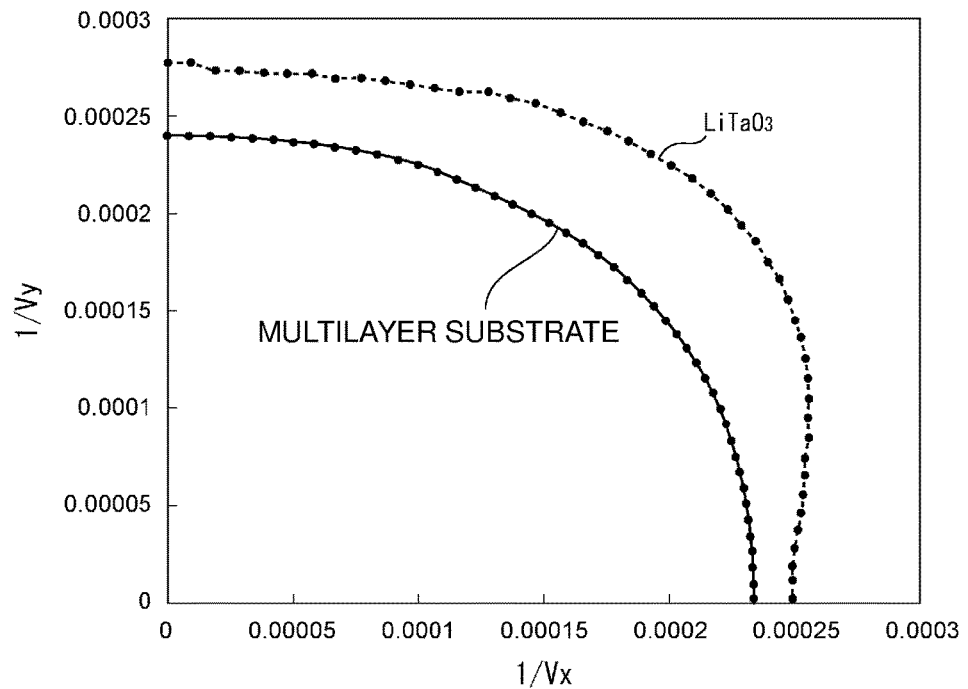
FIG. 5 is an illustration representing reverse-velocity surfaces (the inverse number of SAW-phase velocity) of $LiTaO_3$ and a multilayer substrate included in the first preferred embodiment of the present invention.

The reason that the gap length G is to be reduced as described above is presumably as follows. In FIG. 5, a solid line represents a reverse-velocity surface (the inverse number of SAW-phase velocity) in the multilayer substrate 2, and a dotted line represents a reverse-velocity surface (the inverse number of SAW-phase velocity) in a piezoelectric substrate made of LiTaO$_3$ alone. As seen from FIG. 5, in the case of using the multilayer substrate 2, the reverse-velocity surface (the inverse number of SAW-phase velocity) is convex. Furthermore, the reverse-velocity surface (the inverse number of SAW-phase velocity) of the multilayer substrate 2 is different from that of the piezoelectric substrate made of LiTaO$_3$ alone. Such a difference is presumably the cause of deterioration of the propagation loss when the gap length G is increased. More specifically, the acoustic velocity of a bulk wave due to an SH component in the low acoustic velocity material layer 4 is about 3750 m/s, which is very close to the acoustic velocity of the acoustic wave excited in the IDT electrode 6. Accordingly, the bulk wave tends to couple with a mode utilized as the acoustic wave. Therefore, when the gap length G is increased, the acoustic wave excited as a main mode leaks in a depth direction of the piezoelectric film 5. For that reason, the propagation loss deteriorates.

Figure 8:
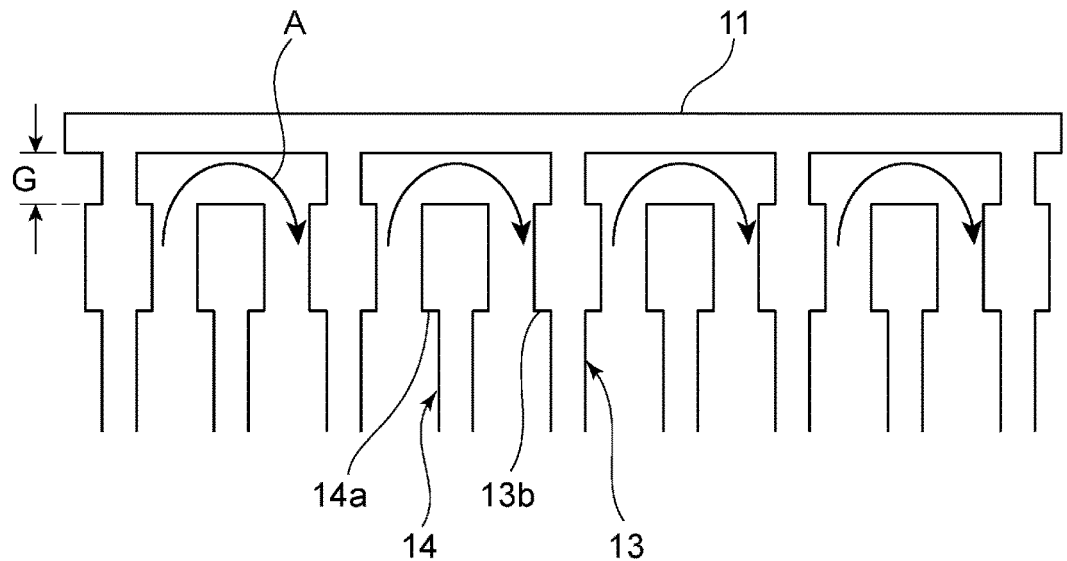
FIG. 8 is a schematic view to explain the reason why a propagation loss reduces in the acoustic wave device according to the first preferred embodiment of the present invention.

On the other hand, in the acoustic wave device 1, the gap length G is reduced. Accordingly, it is determined that, as denoted by arrows A in FIG. 8, the acoustic wave in the main mode tending to leak in the depth direction is reflected by an inner edge of the first busbar 11, which is positioned closer to the tips of the electrode fingers, and that leakage in the thickness direction is reduced or prevented. As a result, an improvement of the return loss characteristics and a reduction of the propagation loss are achieved.

Figure 9:
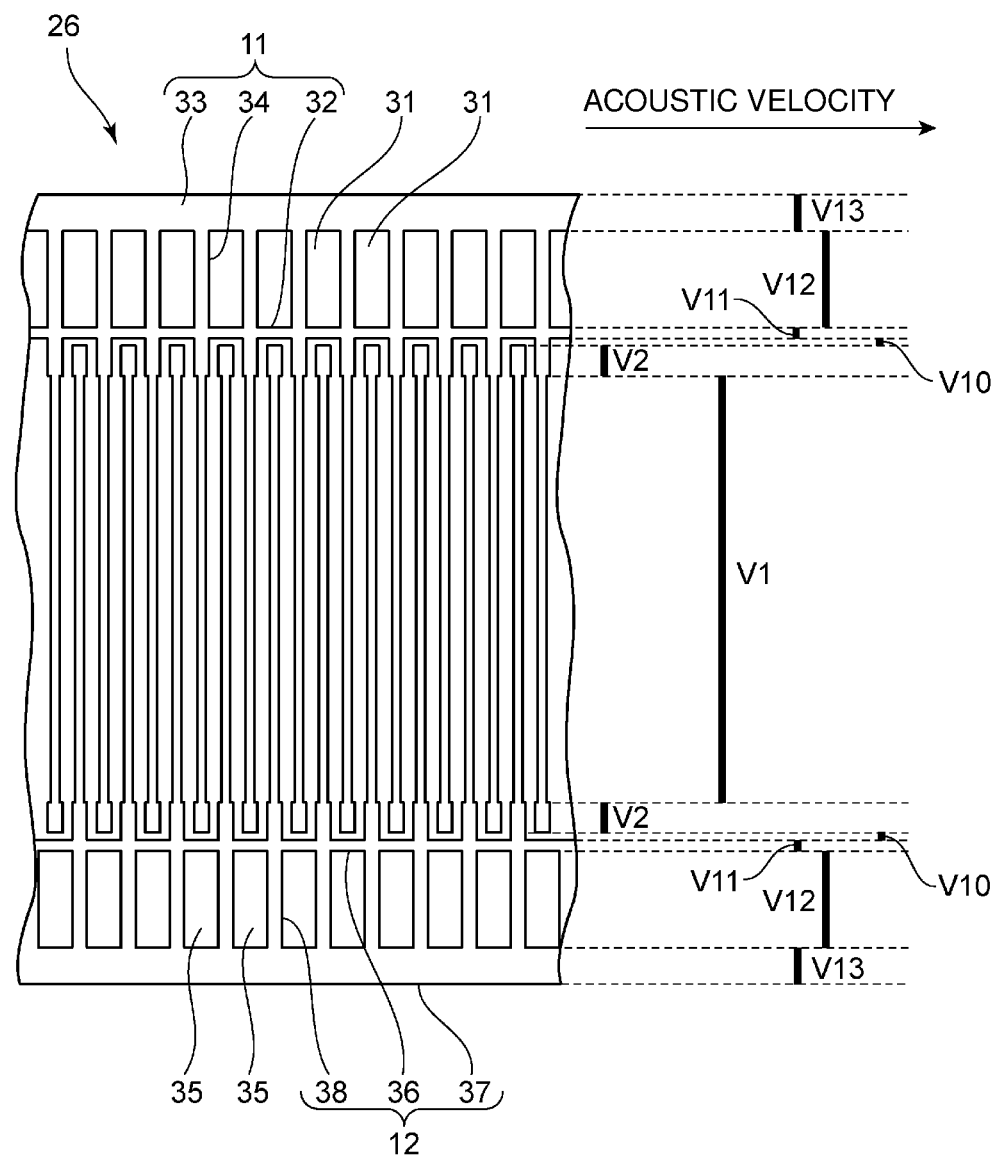
FIG. 9 is a partial plan view, partially cut out, illustrating an electrode structure of an acoustic wave device according to a second preferred embodiment of the present invention, and acoustic velocities in various regions.

FIG. 9 is a partial plan view, partially cut out, illustrating, in an enlarged scale, a principal portion of an electrode structure of an acoustic wave device according to a second preferred embodiment of the present invention. The acoustic wave device according to the second preferred embodiment is similar to the acoustic wave device 1 according to the first preferred embodiment except that, in an IDT electrode 26, structures of the first and second busbars 11 and 12 are different from those in the IDT electrode 6 illustrated in FIG. 1.

In the IDT electrode 26, a plurality of openings 31 and are provided in the first and second busbars 11 and 12, respectively. The openings 31 are arrayed side by side in the propagation direction of the acoustic wave. The openings 35 are also arrayed side by side in the propagation direction of the acoustic wave.

Portions of the first and second busbars 11 and 12 on the side closer to the intersecting region than the openings 31 and 35 define and function as first and second thin busbar portions 32 and 36, respectively. Portions of the first and second busbars 11 and 12 on the side farther away from the intersecting region than the openings 31 and 35 define and function as first and second outer busbar portions 33 and 37, respectively. The first thin busbar portion 32 and the first outer busbar portion 33 are connected to each other by a plurality of connecting portions 34. The connecting portions 34 are each positioned between the adjacent openings 31.

Similarly, in the second busbar 12, the second thin busbar portion 36 and the second outer busbar portion 37 are connected to each other by a plurality of connecting portions 38.

The connecting portion 34 is disposed along an extension of the first electrode finger 13 in a direction outward from the intersecting region. The connecting portion 38 is disposed at a position along an extension of the second electrode finger 14 in a direction outward from the intersecting region.

Also in the acoustic wave device according to the second preferred embodiment, the gap lengths between the tips of the first and second electrode fingers 13, 14 and the second and first busbars 12, 11 are preferably set to about 0.23λ or shorter, for example. Thus, the propagation loss is reduced as in the first preferred embodiment.

In the acoustic wave device according to the second preferred embodiment, the acoustic velocities in various regions crossing perpendicularly or substantially perpendicularly to the propagation direction of the acoustic wave in the IDT electrode 26 are as shown in FIG. 9.

The acoustic velocity in the central region is denoted by V1, and that the acoustic velocity in the first and second edge regions is denoted by V2. In addition, the acoustic velocity in the first and second gap regions is denoted by V10, the acoustic velocity in the first and second thin busbar portions 32 and 36 is denoted by V11, the acoustic velocity in regions at which the openings 31 and 35 are provided is denoted by V12, and the acoustic velocity in regions at which the first and second outer busbar portions 33 and 37 are disposed is denoted by V13. Those acoustic velocities V1, V2 and V10 to V13 preferably satisfy a relationship of V10>V12>V11=V13>V1>V2.

In the above-described case, the second or first gap and the first or second thin busbar portion 32 or 36 provide higher acoustic velocity regions in comparison with the first or second edge region. As a result, transverse mode ripples are reduced or prevented as in the first preferred embodiment.

Figure 10:
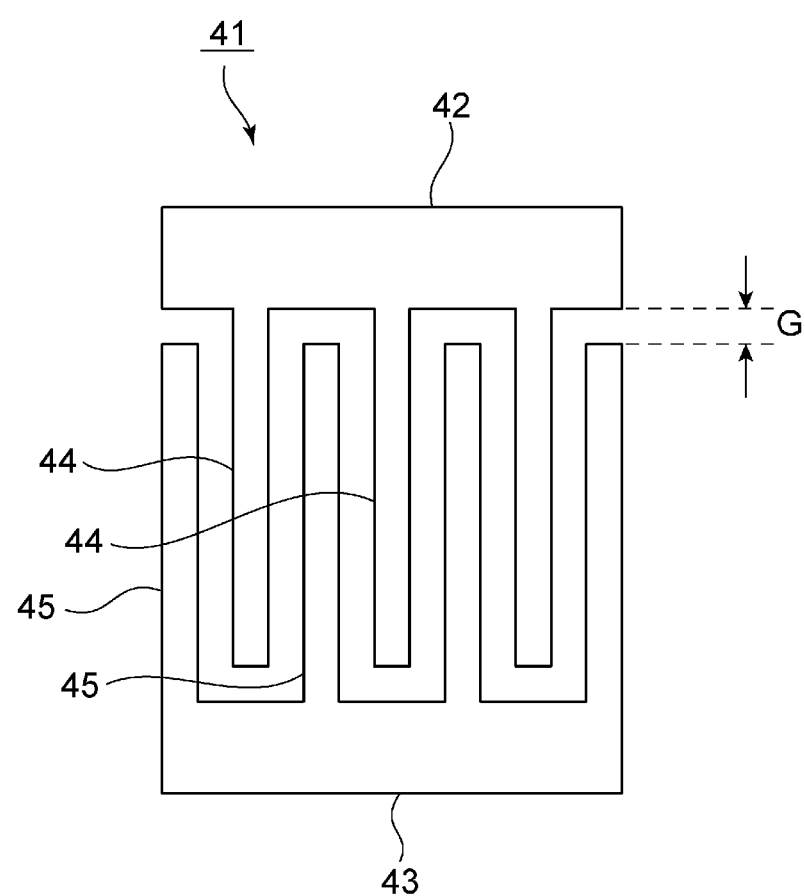
FIG. 10 is a plan view to explain an electrode structure of an acoustic wave device according to a third preferred embodiment of the present invention.

FIG. 10 is a plan view illustrating an electrode structure of an acoustic wave device according to a third preferred embodiment of the present invention. In the acoustic wave device according to the third preferred embodiment, an IDT electrode 41 is a normal IDT electrode. A first busbar 42 and a second busbar 43 are opposed to each other. One end of each of a plurality of first electrode fingers 44 is connected to the first busbar 42. One end of each of a plurality of second electrode fingers 45 is connected to the second busbar 43. Furthermore, the first and second electrode fingers 44 and 45 have a constant or substantially constant width over the entire length. Thus, the acoustic wave device may preferably include the normal IDT electrode.

Also in the present preferred embodiment, gap lengths G between tips of the first and second electrode fingers 44, 45 and the second and first busbars 43, 42 are preferably set to about 0.23λ or shorter, for example. Thus, the propagation loss is reduced as in the first and second preferred embodiments.

Figure 11:
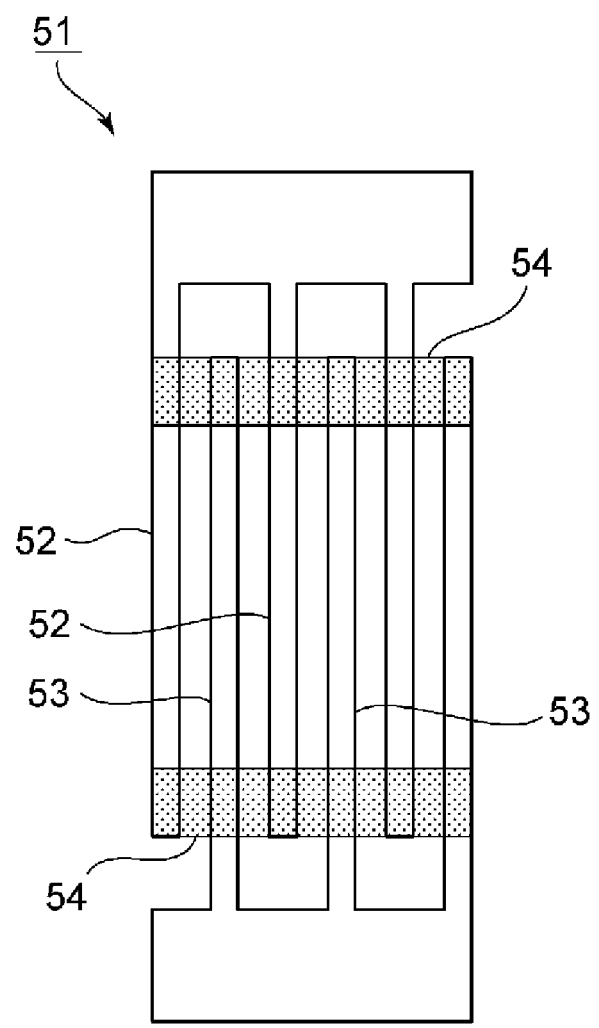
FIG. 11 is a plan view to explain an IDT electrode in an acoustic wave device according to a fourth preferred embodiment of the present invention.

FIG. 11 is a plan view to explain an IDT electrode 51 in an acoustic wave device according to a fourth preferred embodiment of the present invention. In the acoustic wave device according to the fourth preferred embodiment, a plurality of first electrode fingers 52 and a plurality of second electrode fingers 53 are laminated in the IDT electrode 51. The first electrode fingers 52 and the second electrode fingers 53 have a constant or substantially constant width. Moreover, first dielectric films 54 defining and functioning as mass adding films are laminated on the first and second electrode fingers in the first and second edge regions thereof.

The first dielectric film 54 is preferably made of a dielectric such as silicon oxide, tantalum pentoxide, or tellurium oxide, for example. The acoustic velocity is reduced in regions at which the first dielectric films 54 are laminated on the first and second electrode fingers 52 and 53. The first dielectric films 54 extend in the propagation direction of the acoustic wave. Thus, the first dielectric films 54 are laminated on the piezoelectric film 5 as well as between the first and second electrode fingers 52 and 53.

Figure 12:
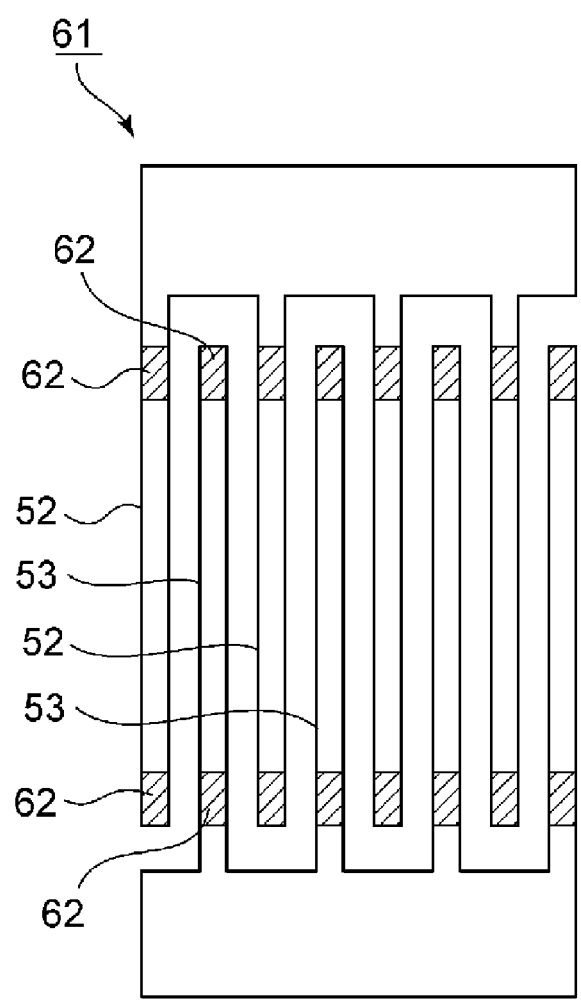
FIG. 12 is a plan view to explain an electrode structure of an IDT electrode in an acoustic wave device according to a fifth preferred embodiment of the present invention.

FIG. 12 is a plan view to explain an IDT electrode 61 in an acoustic wave device according to a fifth preferred embodiment of the present invention. In the IDT electrode 61, metal films 62 defining and functioning as mass adding films are laminated on portions of the first and second electrode fingers 52 and 53, those portions being positioned in the first and second edge regions. Thus, the acoustic velocity is reduced in the first and second edge regions.

Figure 13:
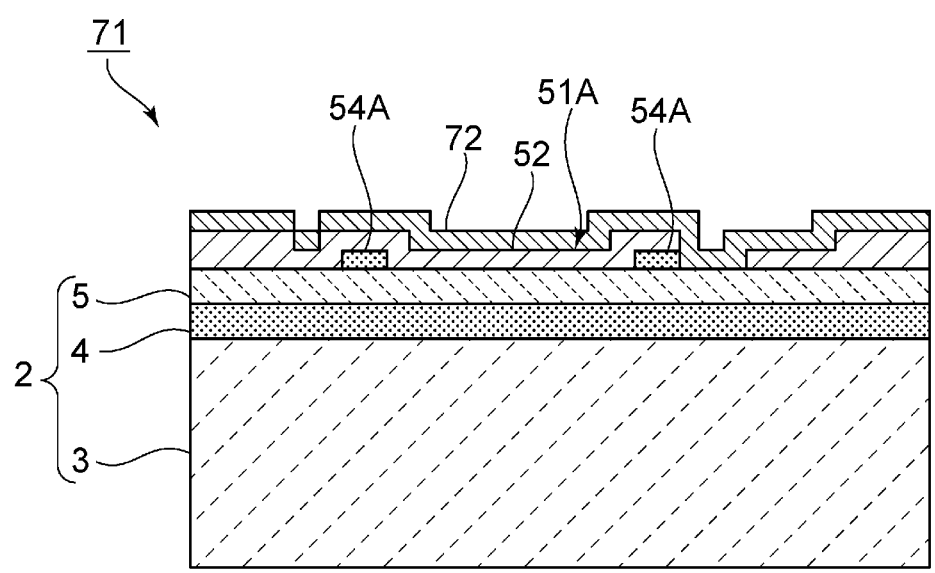
FIG. 13 is a schematic side sectional view of an acoustic wave device according to a sixth preferred embodiment of the present invention.

FIG. 13 is a schematic side sectional view of an acoustic wave device 71 according to a sixth preferred embodiment of the present invention. In the acoustic wave device 71, first dielectric films 54A are laminated under an IDT electrode 51A. More specifically, the first dielectric films 54A are laminated under the first electrode fingers 52 in the first and second edge regions thereof. Thus, the first dielectric films 54A may preferably be disposed under the IDT electrode 51A in an opposite positional relationship to the above-described first dielectric films 54. Furthermore, in the acoustic wave device 71, a second dielectric film 72 covers the IDT electrode 51A. With the second dielectric film 72, it is possible to protect the IDT electrode 51A and to perform frequency adjustment. In other words, the frequency adjustment is performed by adjusting a thickness and a material of the second dielectric film 72.

Also in the acoustic wave devices according to the fourth to sixth preferred embodiments, the propagation loss is reduced as in the first preferred embodiment preferably by setting the gap length G to about $0.23\lambda$ or shorter, for example.

Figure 14:
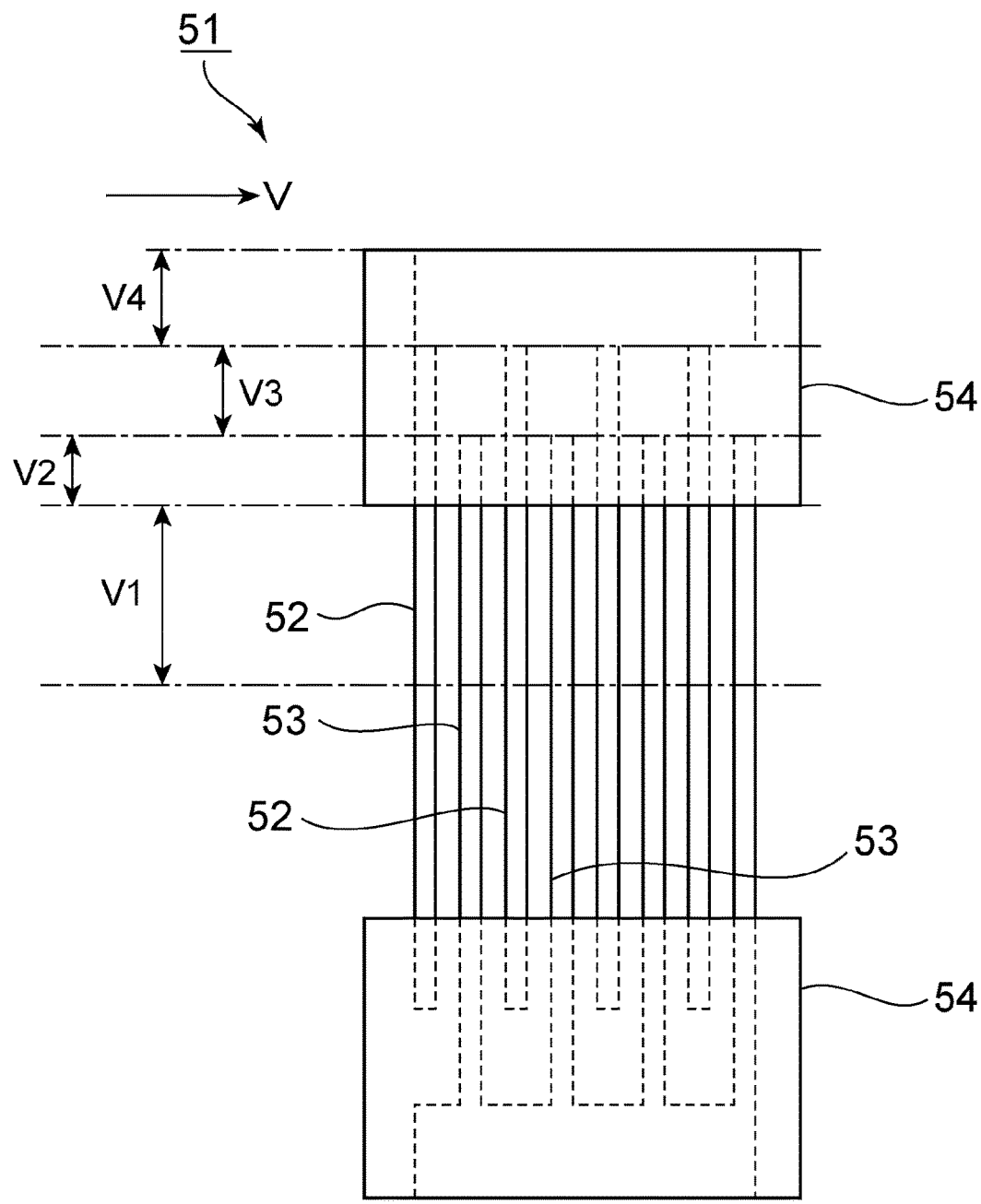
FIG. 14 is a plan view to explain an electrode structure of an IDT electrode in an acoustic wave device according to a seventh preferred embodiment of the present invention.
Figure 15:
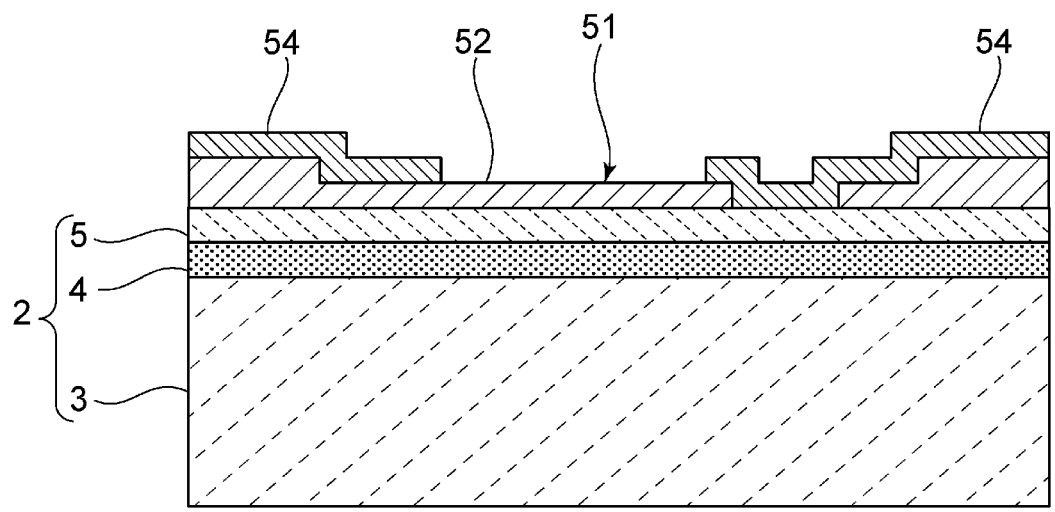
FIG. 15 is a schematic side sectional view of the acoustic wave device according to the seventh preferred embodiment of the present invention.

FIG. 14 is a plan view to explain an IDT electrode in an acoustic wave device according to a seventh preferred embodiment of the present invention. FIG. 15 is a schematic side sectional view of the acoustic wave device illustrated in FIG. 14.

In the seventh preferred embodiment, first dielectric films 54 are laminated on the IDT electrode 51. While, in FIG. 11, the first dielectric films 54 are disposed in the first and second edge regions, the first dielectric films 54 are laminated, in the seventh preferred embodiment illustrated in FIG. 14, so as to cover not only the first and second edge regions, but also the gap regions and the first and second busbars. Also in such a case, the acoustic velocities in the first and second edge regions are reduced with the lamination of the first dielectric films 54. Furthermore, in the seventh preferred embodiment, the acoustic velocity in the central region is denoted by V1, the acoustic velocity in the first and second edge regions is denoted by V2, the acoustic velocity in the gap regions is denoted by V3, and the acoustic velocity in regions at which the first and second busbars are disposed is denoted by V4, those acoustic velocities preferably satisfy a relationship of V3>V1≈V4>V2. Also in the present preferred embodiment, therefore, the propagation loss is reduced preferably by setting the gap length to about $0.23\lambda$ or shorter, for example.

Figure 16:
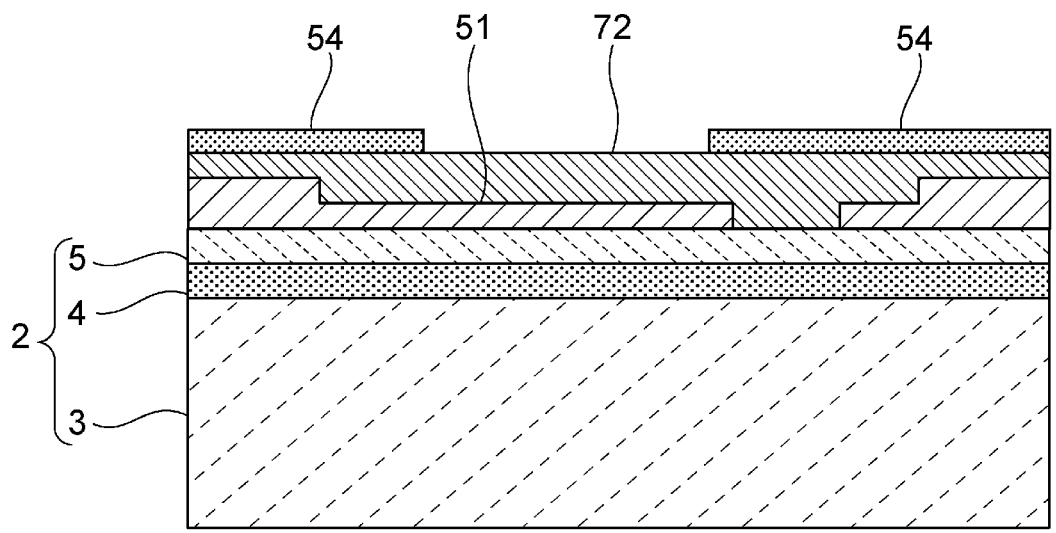
FIG. 16 is a schematic side sectional view of an acoustic wave device according to an eighth preferred embodiment of the present invention.

FIG. 16 is a side sectional view of an acoustic wave device according to an eighth preferred embodiment of the present invention. In the acoustic wave device according to the eighth preferred embodiment, a second dielectric film 72 defining and functioning as a frequency adjustment film is laminated between the first dielectric film 54 and the IDT electrode 51. The second dielectric film 72 is preferably made of an appropriate dielectric such as silicon oxide, for example. With the second dielectric film 72, frequency adjustment is able to be performed. Thus, the second dielectric film 72 may preferably be disposed between the first dielectric film 54 and the IDT electrode 51.

Figure 17:
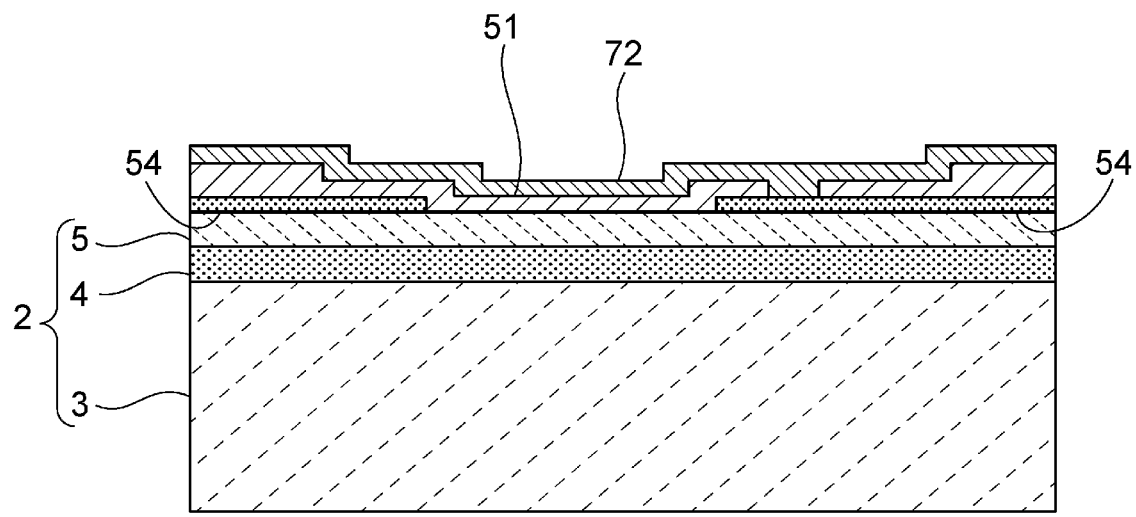
FIG. 17 is a schematic side sectional view to explain a modification of the acoustic wave device according to the eighth preferred embodiment of the present invention.

Furthermore, while the first dielectric films 54 are laminated on the IDT electrode 51 in FIG. 15, the first dielectric films 54 may be disposed under the IDT electrode 51 as illustrated in FIG. 17. In such a case, the second dielectric film 72 defining and functioning as the frequency adjustment film may cover the IDT electrode 51.

Figure 18:
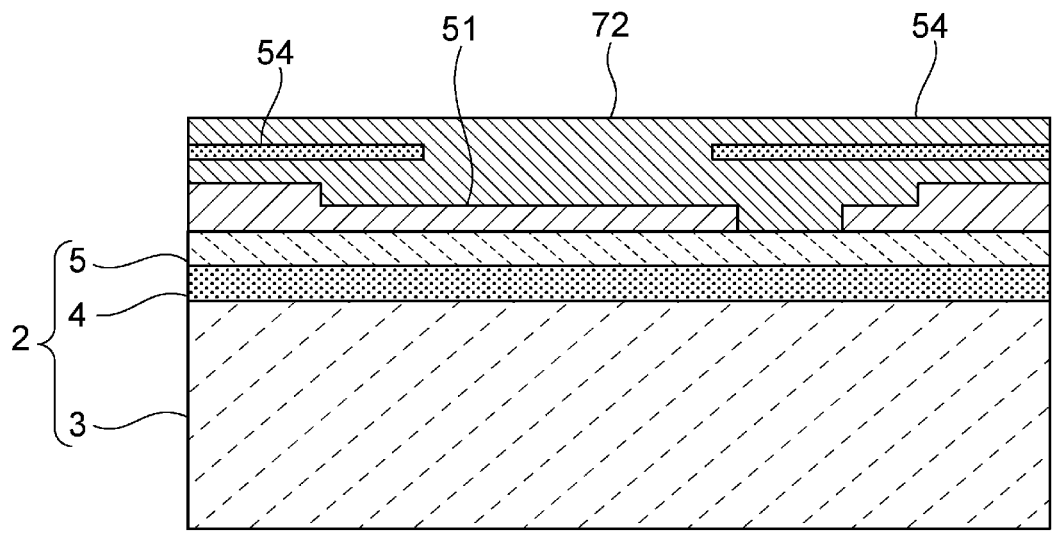
FIG. 18 is a schematic side sectional view to explain another modification of the acoustic wave device according to the eighth preferred embodiment of the present invention.

As illustrated in FIG. 18, the second dielectric film 72 may cover the IDT electrode 51, and the first dielectric films 54 may be embedded in the second dielectric film 72.

Also with the structures illustrated in FIGS. 14 to 18, since the gap regions provide the high acoustic velocity regions, the propagation loss is reduced preferably when the gap length G is reduced to about $0.23\lambda$ or shorter, for example.

Figure 19:
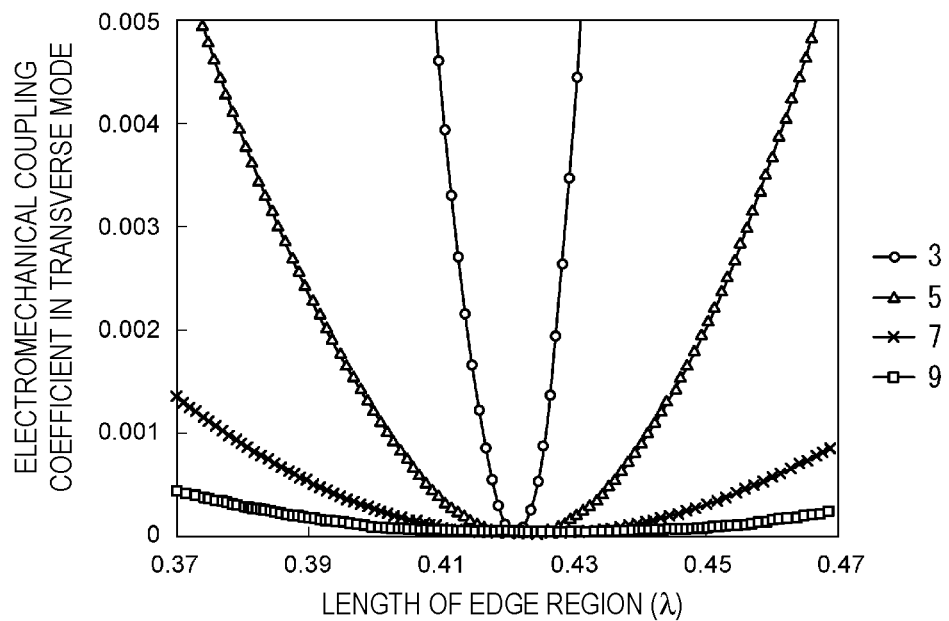
FIG. 19 is a graph representing relationships between the length of an edge region and the electromechanical coupling coefficient in transverse modes in the acoustic wave device according to the fourth preferred embodiment of the present invention.
Figure 20:
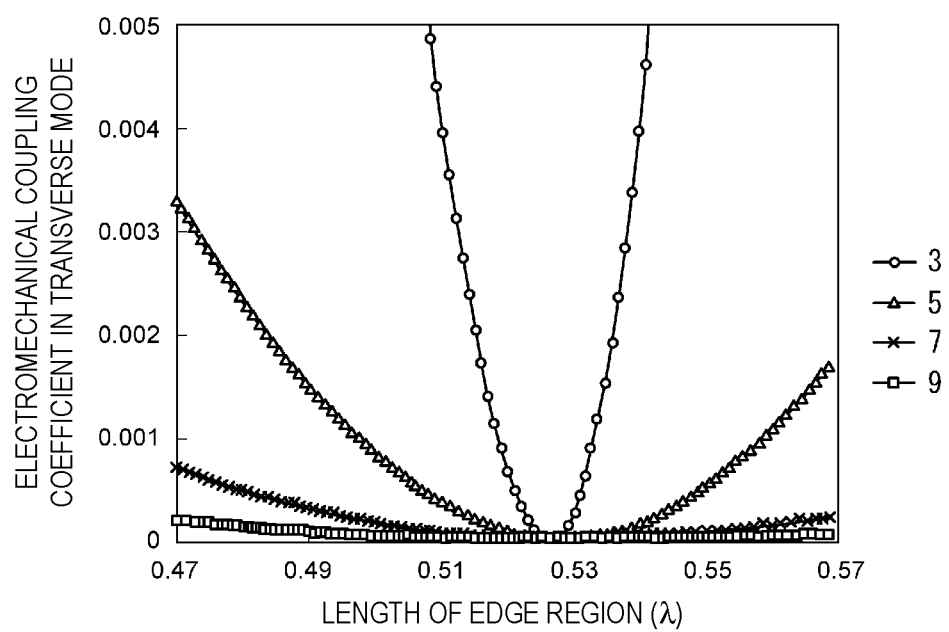
FIG. 20 is a graph representing relationships between the length of an edge region and the electromechanical coupling coefficient in transverse modes in the acoustic wave device according to the seventh preferred embodiment of the present invention.

FIG. 19 is a graph representing relationships between the length of the edge region and the electromechanical coupling coefficient in transverse modes in the acoustic wave device including the IDT electrode illustrated in FIG. 11. The length of the edge region is a length of each of the first and second edge regions in the extension direction of the first and second electrode fingers. FIG. 20 is a graph representing relationships between the length of the edge region and the electromechanical coupling coefficient in transverse modes in the acoustic wave device including the IDT electrode illustrated in FIG. 14. Each of FIGS. 19 and 20 represents the result for the third, fifth, seventh, and ninth transverse modes. Compared to the result plotted in FIG. 19, the ability to reduce or prevent the transverse modes with respect to variations in tip size of the IDT electrode 51 is higher in the result plotted in FIG. 20. For that reason, the first dielectric films 54 preferably cover not only the first and second edge regions, but also the gap regions and the regions at which the first and second busbars are disposed, as illustrated in FIG. 14.

Figure 21:
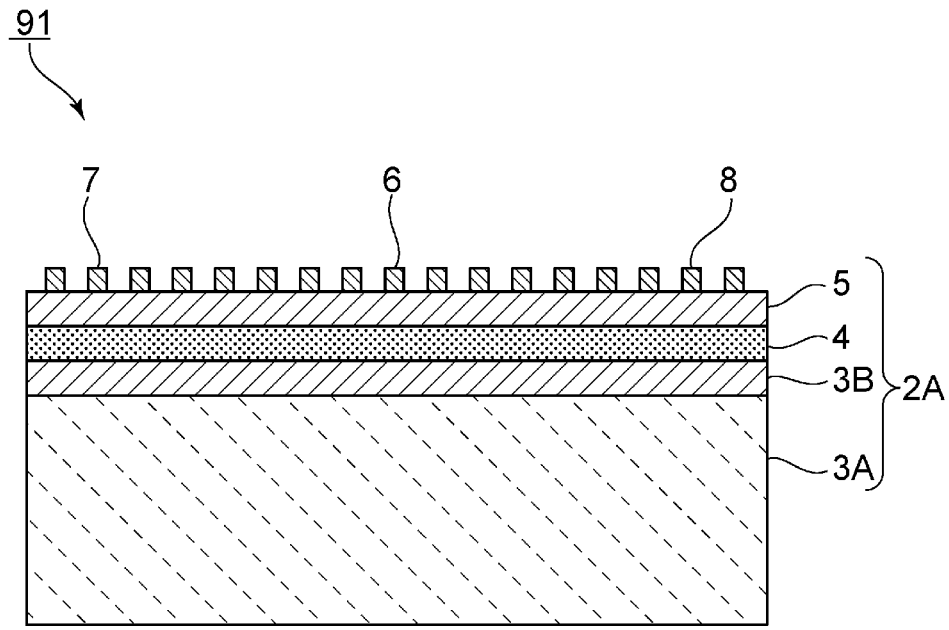
FIG. 21 is a front sectional view of an acoustic wave device according to a ninth preferred embodiment of the present invention.

FIG. 21 is a front sectional view of an acoustic wave device 91 according to a ninth preferred embodiment of the present invention. The acoustic wave device 91 includes a multilayer substrate 2A. In the multilayer substrate 2A, a high acoustic velocity material layer 3B, a low acoustic velocity material layer 4, and a piezoelectric film 5 preferably made of $LiTaO_3$, for example, are laminated on a support substrate 3A. Because the high acoustic velocity material layer 3B is provided, the support substrate 3A may preferably be made of a material other than the high acoustic velocity material. Of course, the support substrate 3A may be made of the high acoustic velocity material.

The acoustic wave device 91 is similar to the acoustic wave device 1 according to the first preferred embodiment, except that the multilayer substrate 2A has a different structure from the multilayer substrate 2 illustrated in FIG. 2. Therefore, the propagation loss is reduced in the acoustic wave device 71 according to the ninth preferred embodiment as well.

Figure 22:
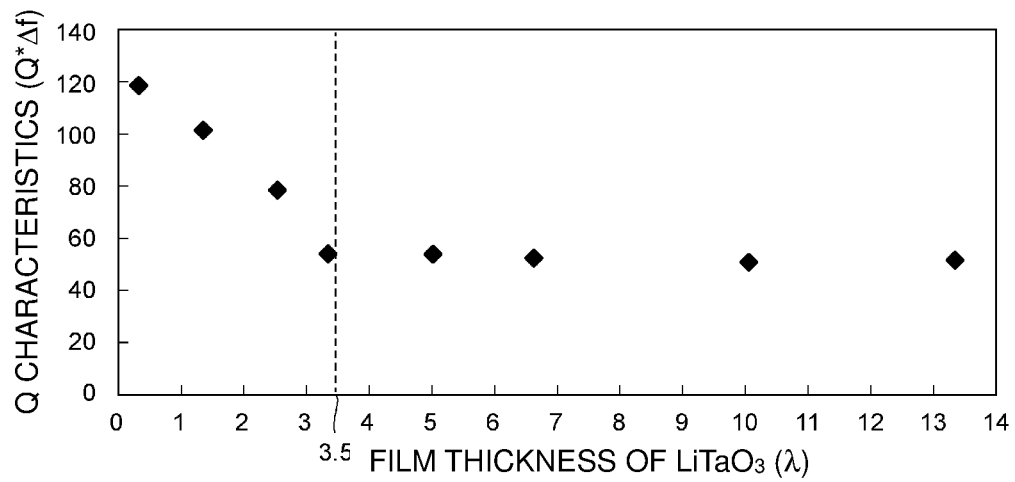
FIG. 22 is a graph representing a relationship between a film thickness of $LiTaO_3$ and Q characteristics.

When the multilayer substrates 2 and 2A illustrated in FIGS. 2 and 21 are used, the thickness of the piezoelectric film 5 is preferably about $3.5\lambda$ or smaller, for example. As plotted in FIG. 22, when the multilayer substrate 2 is used, Q characteristics degrade when the film thickness of $LiTaO_3$ exceeds about $3.5\lambda$. Thus, the thickness of $LiTaO_3$ is preferably about $3.5\lambda$ or smaller, for example, so as to improve the Q characteristics.

The above-described high acoustic velocity material may preferably be selected from among semiconductors such as Si, inorganic insulators such as SiN and $Al_2O_3$, metals such as Pt and W, and alloys of those metals, for example.

The above-described low acoustic velocity material may preferably be selected from among inorganic insulating materials such as silicon oxide and silicon oxynitride, and resin materials, for example.

It is to be noted that appropriate materials may be used as the high acoustic velocity material and the low acoustic velocity material in proper combinations as long as the above-described relationship in the acoustic velocity is satisfied.

While the first to ninth preferred embodiments have been described in connection with the one-port acoustic wave resonator, the present invention may be further applied to acoustic wave devices including other electrode structures, such as an acoustic wave filter, as long as the IDT electrode has the above-described structure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a multilayer substrate including:
a convex reverse-velocity surface;
a piezoelectric film;
a low acoustic velocity material layer in which a bulk wave having lower velocity than an acoustic velocity of a bulk wave propagating in the piezoelectric film propagates; and
a high acoustic velocity material layer in which a bulk wave having higher velocity than the acoustic velocity of the bulk wave propagating in the piezoelectric film propagates, the low acoustic velocity material layer being located between the high acoustic velocity material layer and the piezoelectric film; and
an IDT electrode disposed on the piezoelectric film; wherein
the IDT electrode includes first and second busbars opposing each other, a plurality of first electrode fingers extending from the first busbar toward the second busbar, and a plurality of second electrode fingers extending from the second busbar toward the first busbar; and
gap lengths of a first gap between a tip of each of the first electrode fingers and the second busbar and a second gap between a tip of each of the second electrode fingers and the first busbar are about 0.23, or less, the gap lengths extending in an extension direction of the first and second electrode fingers, and $\lambda$ is a wavelength defined by a pitch of the first and second electrode fingers.

2. The acoustic wave device according to claim 1, wherein in the IDT electrode, an intersecting region in which the first electrode fingers and the second electrode fingers are overlapped with each other in a propagation direction of the acoustic wave includes a central region at a middle portion in the extension direction of the first and second electrode fingers, and first and second edge regions on both outer sides of the central region in the extension direction of the first and second electrode fingers; and
an acoustic velocity in each of the first and second edge regions is lower than an acoustic velocity in the central region.

3. The acoustic wave device according to claim 2, wherein first dielectric films defining mass adding films are provided on the first and second edge regions.

4. The acoustic wave device according to claim 3, wherein the first dielectric films are further provided on the first and second busbars and over the first and second gaps.

5. The acoustic wave device according to claim 4, wherein a second dielectric film defining a frequency adjustment film is provided on the IDT electrode, and the first dielectric films are provided with the second dielectric film interposed between the IDT electrode and the first dielectric films.

6. The acoustic wave device according to claim 3, wherein the first dielectric films are made of silicon oxide, tantalum pentoxide, or tellurium oxide.

7. The acoustic wave device according to claim 2, wherein each of the first and second busbars includes a plurality of openings arrayed side by side in the propagation direction of the acoustic wave, portions of the first and second busbars on a side closer to the intersecting region than the openings define first and second thin busbar portions, and portions of the first and second busbars on a side farther away from the intersecting region than the openings define first and second outer busbar portions, the first and second thin busbar portions being connected respectively to the first and second outer busbar portions by connecting portions each positioned between the adjacent openings.

8. The acoustic wave device according to claim 7, wherein the connecting portions are disposed along extensions of respective ones of the first and second electrode fingers in a direction outward from the intersecting region.

9. The acoustic wave device according to claim 2, wherein widths of the first and second electrode fingers in the first and second edge regions are greater than widths of the first and second electrode fingers in the central region, the widths extending in the propagation direction of the acoustic wave.

10. The acoustic wave device according to claim 2, wherein metal films defining mass adding films are provided on portions of the first and second electrode fingers, the portions being provided in the first and second edge regions.

11. The acoustic wave device according to claim 1, wherein the piezoelectric film is made of $LiTaO_3$ and has a thickness of about $3.5\lambda$ or smaller.

12. The acoustic wave device according to claim 1, wherein the high acoustic velocity material layer is a support substrate made of a high acoustic velocity material.

13. The acoustic wave device according to claim 1, further comprising a support substrate that supports the high acoustic velocity material layer.

14. The acoustic wave device according to claim 1, wherein the piezoelectric film is made of $LiTaO_3$.

15. The acoustic wave device according to claim 1, further comprising reflectors disposed on the piezoelectric film such that the IDT electrode is disposed therebetween in a propagation direction of the acoustic wave.

16. The acoustic wave device according to claim 1, wherein the high acoustic velocity material layer is made of Si, SiN, $Al_2O_3$, Pt, W, or an alloy of Pt or W.

17. The acoustic wave device according to claim 1, wherein low acoustic velocity material layer is made of silicon oxide, silicon oxynitride, or a resin material.

* * * * *